United States Patent
Lee

(10) Patent No.: US 7,338,850 B2
(45) Date of Patent: Mar. 4, 2008

(54) METHOD FOR MANUFACTURING DEVICE ISOLATION FILM OF SEMICONDUCTOR DEVICE

(75) Inventor: Sang Don Lee, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 337 days.

(21) Appl. No.: 10/998,967

(22) Filed: Nov. 30, 2004

(65) Prior Publication Data

US 2006/0024912 A1    Feb. 2, 2006

(30) Foreign Application Priority Data

Jul. 13, 2004    (KR) .................. 10-2004-0054280

(51) Int. Cl.
*H01L 21/8238*    (2006.01)
(52) U.S. Cl. .............. 438/221; 438/296; 438/437; 438/743; 438/770; 438/954
(58) Field of Classification Search ............... 438/218, 438/221, 294, 296, 424, 435, 437, 743, 770–774, 438/954
See application file for complete search history.

(56) References Cited

U.S. PATENT DOCUMENTS

| | | | | |
|---|---|---|---|---|
| 5,960,276 A | * | 9/1999 | Liaw et al. ............. | 438/224 |
| 6,306,720 B1 | * | 10/2001 | Ding ............................ | 438/391 |
| 6,383,861 B1 | * | 5/2002 | Gonzalez et al. ............ | 438/241 |
| 6,486,517 B2 | * | 11/2002 | Park ............................ | 257/374 |
| 6,548,406 B2 | * | 4/2003 | Lai et al. ...................... | 438/689 |
| 6,919,251 B2 | * | 7/2005 | Rotondaro et al. .......... | 438/287 |
| 7,163,869 B2 | * | 1/2007 | Kim et al. ................... | 438/424 |
| 7,179,717 B2 | * | 2/2007 | Sandhu et al. .............. | 438/424 |
| 7,199,022 B2 | * | 4/2007 | Yasui et al. .................. | 438/437 |
| 2003/0211692 A1 | * | 11/2003 | Lee .............................. | 438/258 |
| 2004/0198019 A1 | * | 10/2004 | Yasui et al. .................. | 438/435 |
| 2005/0026390 A1 | * | 2/2005 | Chi .............................. | 438/437 |
| 2005/0205948 A1 | * | 9/2005 | Rotondaro et al. .......... | 257/411 |
| 2005/0285179 A1 | * | 12/2005 | Violette ....................... | 257/315 |
| 2006/0264003 A1 | * | 11/2006 | Eun ............................. | 438/424 |

* cited by examiner

*Primary Examiner*—M Wilczewski
*Assistant Examiner*—Toniae M Thomas
(74) *Attorney, Agent, or Firm*—Townsend and Townsend and Crew LLP

(57) ABSTRACT

A method for manufacturing device isolation film of semiconductor device is disclosed. The method utilizes a plasma oxidation of a liner nitride film exposed by etching a liner oxide the film in peripheral region prior to the formation of device isolation film to prevent the generation of a electron trap which causes trapping of electrons at the interface of the oxide film and the nitride film resulting in a HEIP phenomenon.

11 Claims, 8 Drawing Sheets

METHOD FOR MANUFACTURING DEVICE ISOLATION FILM OF SEMICONDUCTOR DEVICE

CORRESPONDING RELATED APPLICATION

This application claims the benefit of and priority to Korean patent application no. KR10-2004-0054280, filed on Jul. 13, 2004, the entire contents of which are incorporated by reference herein in its entirety.

BACKGROUND OF THE INVENTION

1. Field of the Invention

The present invention generally relates to a method for manufacturing a device isolation film of a semiconductor device, and more specifically, to a method for manufacturing a device isolation film of a semiconductor device wherein a liner nitride film exposed by etching a liner oxide in a peripheral region is oxidized using plasma prior to the formation of the device isolation film to prevent or reduce a Hot Electron Induced Punchthrough (HEIP) phenomenon and/or to improve characteristics of a semiconductor device.

2. Description of the Related Art

FIGS. 1a through 1e are cross-sectional diagrams illustrating a conventional method for manufacturing a device isolation film of a semiconductor device.

Referring to FIG. 1a, a pad oxide film 20 and a pad nitride film 30 are sequentially formed on a semiconductor substrate 10. The semiconductor substrate 10 includes a cell region 1000a and a peripheral region 1000b.

Referring to FIG. 1b, a predetermined region of the pad nitride film 30, the pad oxide film 20 and the semiconductor substrate 10 where a device isolation film is to be formed is etched to form a trench 40.

Referring to FIG. 1c, a sidewall oxide film 50 is deposited on a surface of the trench 40. Thereafter, a liner nitride film 60 and a liner oxide film 70 are sequentially formed on the entire surface of the semiconductor substrate 10.

Referring to FIG. 1d a gap-filling oxide film 80 is formed on the entire surface of the semiconductor substrate 10 to fill up the trench 40.

Referring to FIG. 1e, the gap-filling oxide film 80 is planarized until the pad nitride film 30 is exposed. Thereafter, the pad nitride film 30 and the pad oxide film 20 are removed to form a device isolation film 90.

The conventional method discussed may reduce a leakage current due to the liner nitride film and the liner oxide film. However, an electron trap is formed at an interface of the nitride film and the oxide film in the pMOS region where a pMOS transistor is formed to trap hot electrons.

Trapped hot electrons may induce a HEIP phenomenon. The HEIP phenomenon refers to a state when a current flow is generated in a channel region even though a voltage is not applied to a gate of the PMOS transistor. The HEIP phenomenon increases a stand-by current of a DRAM, which degrades device characteristics and yield.

In order to address these problems, manufacturing methods have been proposed that increase the thickness of the sidewall oxide film. However, as the thickness of the sidewall oxide film increases, gap-fill characteristics deteriorate and active region width decreases. The deterioration of gap-fill characteristics and decrease in active region width reduces the current driving capability and threshold voltage of a transistor, and degrades refresh characteristics of the transistor. As such, a need exists for an improved method for manufacturing a device isolation film of a semiconductor device.

Other problems with the prior art not described above can also be overcome using the teachings of the present invention, as would be readily apparent to one of ordinary skill in the art after reading this disclosure.

SUMMARY OF THE INVENTION

A method for a method for manufacturing a device isolation film of a semiconductor device is provided, wherein a liner nitride film exposed by removing a liner oxide film in a peripheral region is oxidized using plasma prior to the formation of a device isolation film so that HEIP phenomenon is reduced or prevented, thereby improving semiconductor device characteristics such as a refresh characteristic and a current driving capability.

According to one embodiment of the present invention, there is provided a method for manufacturing a device isolation film of a semiconductor device, comprising sequentially forming a pad oxide film and a pad nitride film on a semiconductor substrate, wherein the semiconductor substrate comprises a peripheral region including a pMOS region and an nMOS region, and a cell region; etching a predetermined region of the pad nitride film, the pad oxide film and the semiconductor substrate where a device isolation film is to be formed to form a trench; forming a sidewall oxide film on a surface of the trench; sequentially forming a liner nitride film and a liner oxide film on surface of the semiconductor substrate including the trench and the pad nitride film; at least removing a portion of the liner oxide film in the pMOS region of the nMOS and pMOS regions of the peripheral region to expose a portion of the liner nitride film under the removed portion of the liner oxide film; oxidizing the exposed portion the liner nitride film; forming a gap-filling oxide film on the semiconductor substrate to fill up the trench; performing a planarization process to expose the pad nitride film; and removing the pad nitride film and the pad oxide film.

DETAILED DESCRIPTION OF THE EXEMPLARY EMBODIMENTS

Reference will now be made in detail to exemplary embodiments of the present invention. Wherever possible, the same reference numbers will be used throughout the drawings to refer to the same or like parts.

FIGS. 2a through 2g are cross-sectional diagrams illustrating a method for manufacturing a device isolation film of a semiconductor device in accordance with an embodiment of the present invention.

Figure 1A:
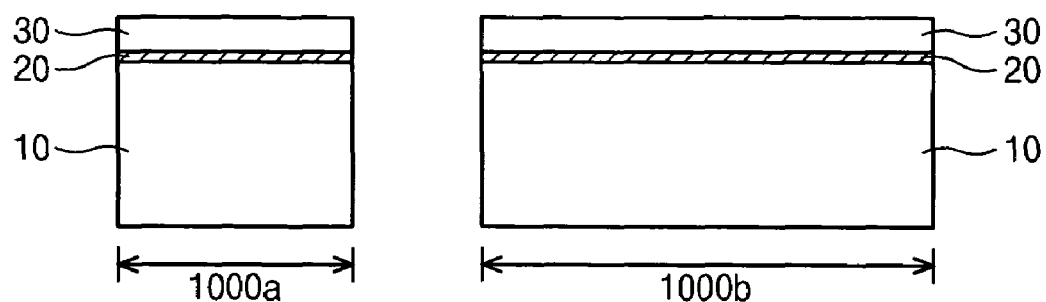
FIGS. 1a through 1e are cross-sectional diagrams illustrating a conventional method for manufacturing a device isolation film of a semiconductor device.
Figure 1B:
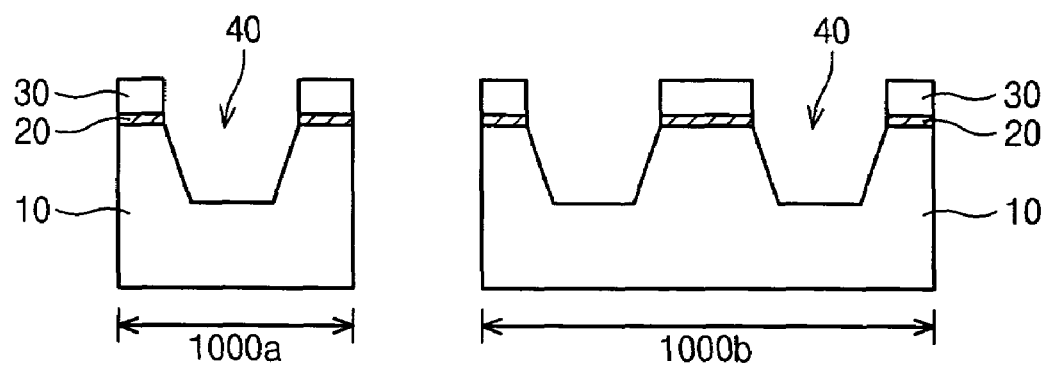
Figure 1C:
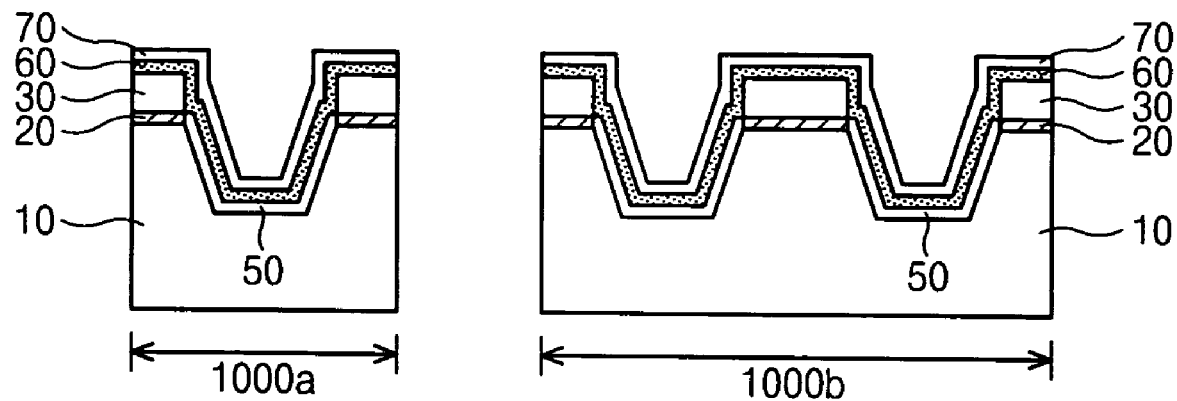
Figure 1D:
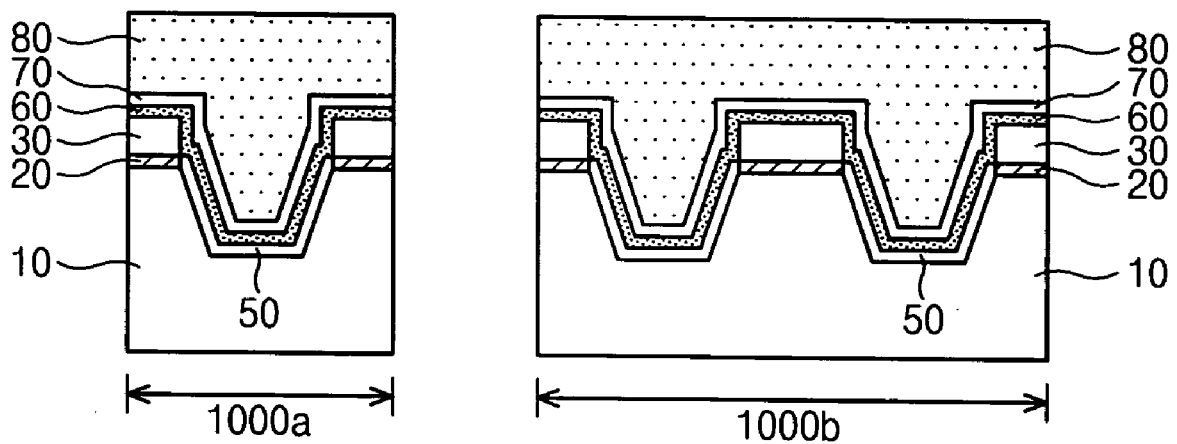
Figure 1E:
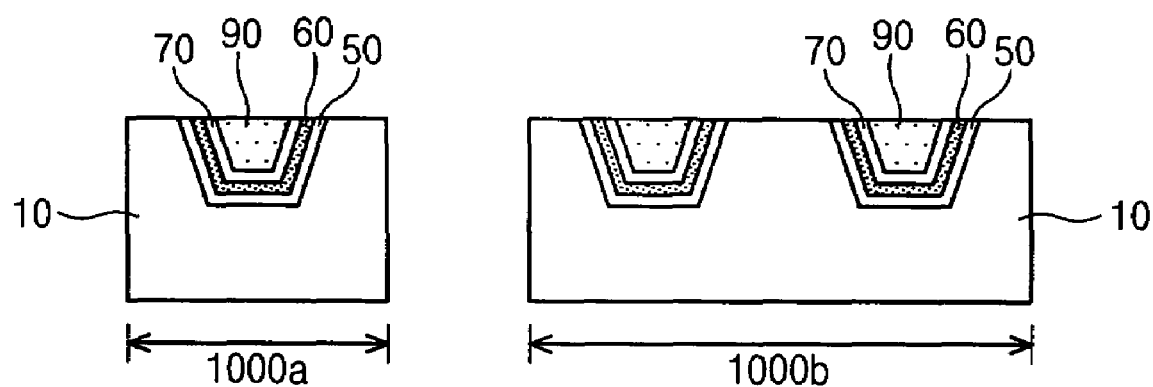
Figure 2A:
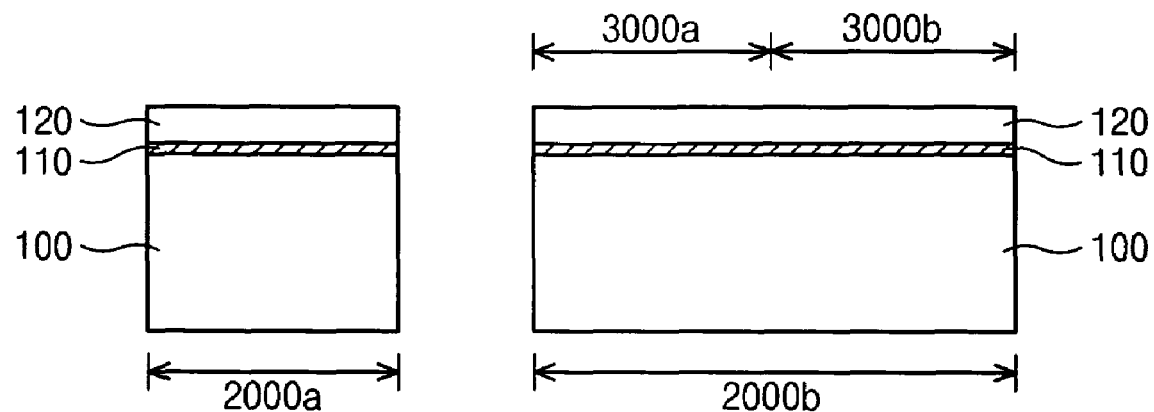
FIGS. 2a through 2g are cross-sectional diagrams illustrating a method for manufacturing a device isolation film of a semiconductor device in accordance with an embodiment of the present invention.

Referring to FIG. 2a, a pad oxide film 110 and a pad nitride film 120 are sequentially formed on a semiconductor substrate 100. The semiconductor substrate 100 comprises a cell region 2000a and a peripheral region 2000b. The peripheral region 2000b also includes a pMOS region 3000a and an nMOS region 3000b.

Figure 2B:
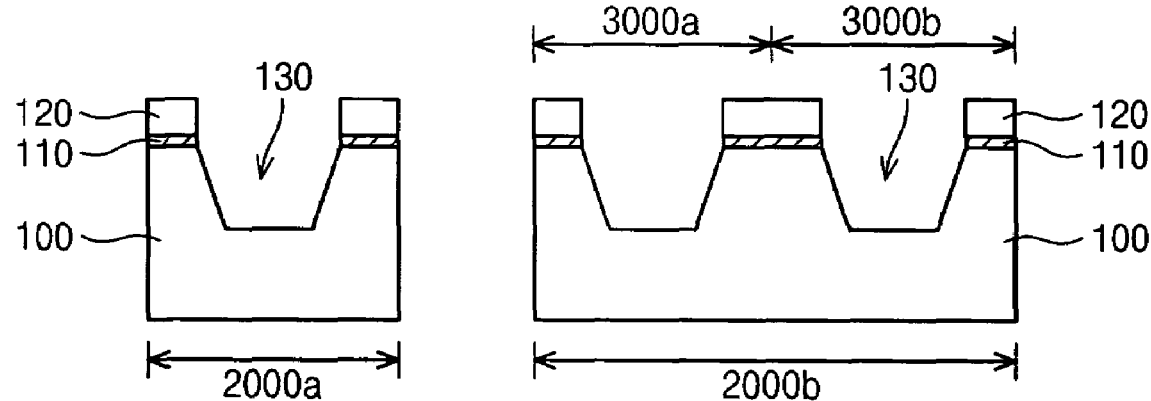

Referring to FIG. 2b, a predetermined region of the pad nitride film 120, the pad oxide film 110 and the semiconductor substrate 100 where a device isolation film is to be formed is etched to form a trench 130.

Figure 2C:
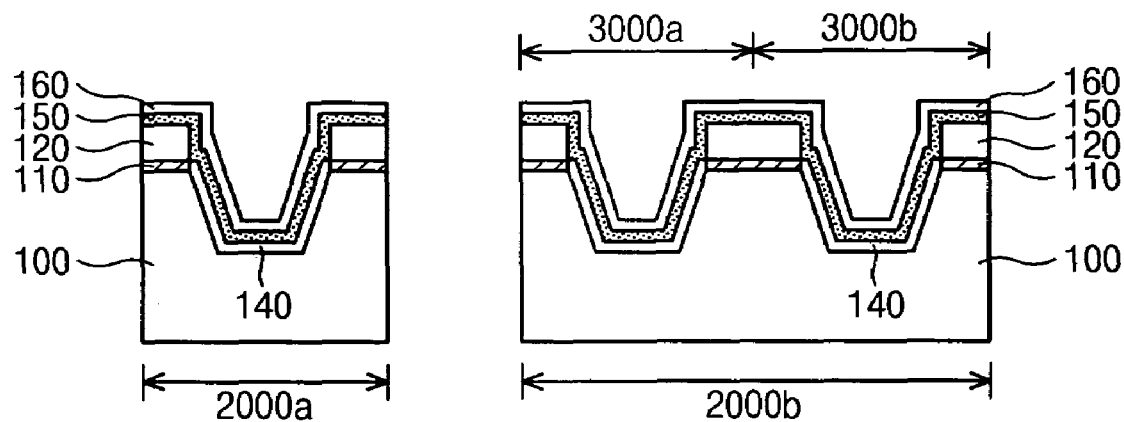

Referring to FIG. 2c, a sidewall oxide film 140 is deposited on a surface of the trench 130. Thereafter, a liner nitride film 150 and a liner oxide film 160 are sequentially formed on the entire surface of the semiconductor substrate 100 including the trench 130 and the pad nitride film 120. Preferably, the sidewall oxide film 140 has a thickness ranging from about 20 Å to about 200 Å. The sidewall oxide film 140 may further be thermally treated via a thermal treatment process under a $NH_3$, a $N_2O$ and/or a NO atmosphere. The liner nitride film 160 preferably has a thickness ranging from about 20 Å to about 100 Å and may further be thermally treated via a thermal treatment process under a $H_2$ atmosphere. The liner oxide film has a thickness ranging from about 20 Å to about 200 Å.

Figure 2D:
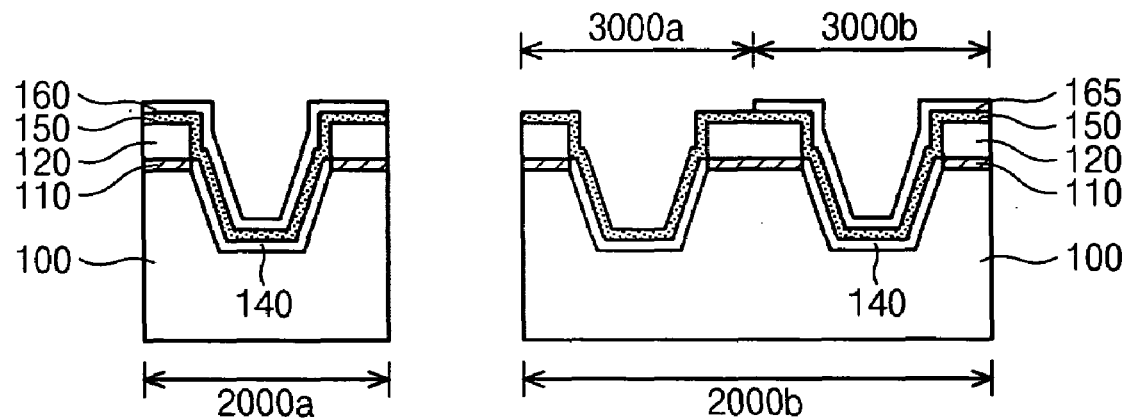

Referring to FIG. 2d, a photoresist film is formed to cover the cell region 2000a and the nMOS region 3000b of the peripheral region 2000b. Thereafter, a portion of the liner oxide film 160 in the pMOS region 3000a is removed by etching using the photoresist film as an etching mask to form a liner oxide film pattern 165. The liner nitride film 150 in the pMOS region 3000a is exposed by the removal process of the liner oxide film 160 in the pMOS region 3000a.

Figure 3A:
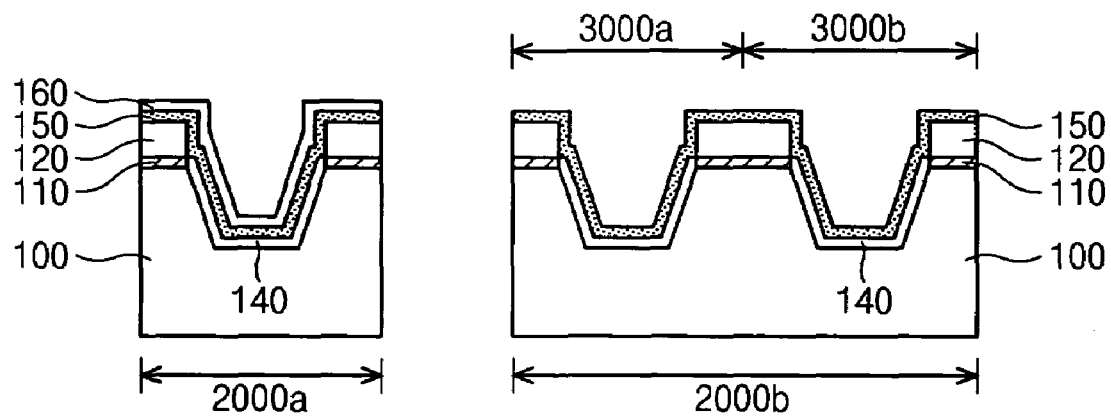
FIGS. 3a and 3b are cross-sectional diagrams illustrating a method for manufacturing a device isolation film of a semiconductor device in accordance with another embodiment of the present invention.

In accordance with another embodiment of the present invention, as shown in FIG. 3a, a photoresist film (not shown) may be formed to cover only the cell region 2000a instead of covering the cell region 2000a and the nMOS region 3000b of the peripheral region 2000b. Thereafter, the entire liner oxide film 160 in the peripheral region 2000b including pMOS region 3000a and the nMOS region 3000b is removed by etching using the photoresist film as an etching mask to expose the liner nitride film 150 in the peripheral region.

Figure 2E:
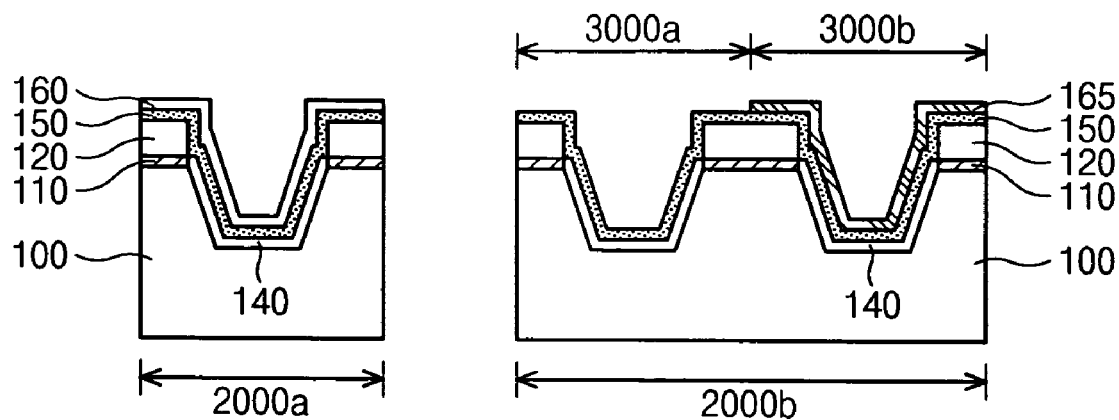

Referring to FIG. 2e, the exposed portion of the liner nitride film 150 is oxidized. When the liner oxide film 160 in the pMOS region 3000a is removed in accordance with one embodiment of the present invention, only the liner nitride film 150 in the pMOS region 3000a is oxidized. When the entire liner oxide film 160 in the peripheral region 2000b including pMOS region 3000a and the nMOS region 3000b is removed in accordance with another embodiment of the present invention, the entire liner nitride film 150 in the peripheral region 2000b is oxidized. Preferably, the oxidation process of the exposed portion the liner nitride film 150 comprises an oxidation process using plasma.

Figure 2F:
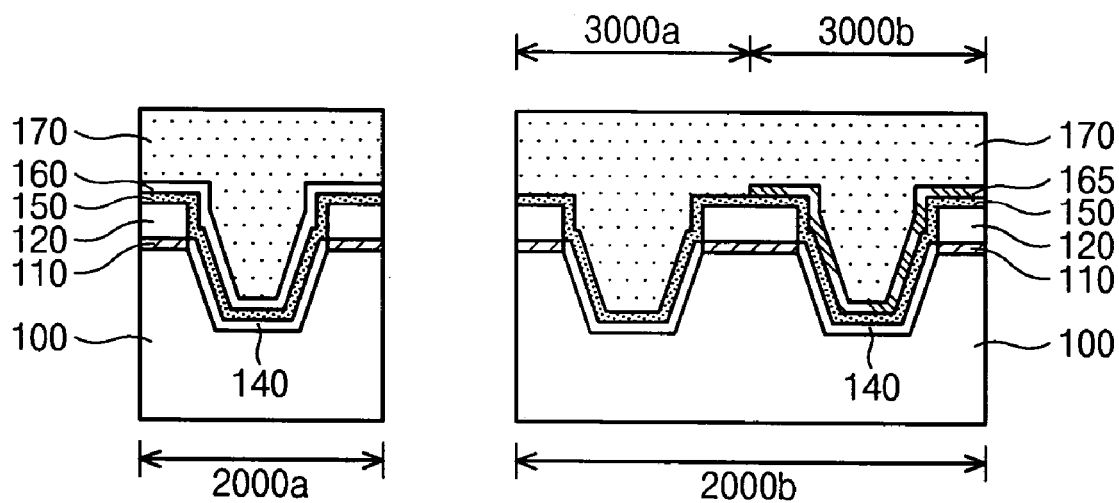

Referring to FIG. 2f a gap-filling oxide film 170 is formed on the entire surface of the semiconductor substrate 100 to fill up the trench 130. Preferably, the gap-filling oxide film 170 is a High Density Plasma (HDP) oxide film. The oxidation process of the liner nitride film 150 shown in FIG. 2e may be performed simultaneously with the formation process of HDP oxide film. That is, during the formation process of HDP oxide film using a high density plasma, the exposed portion of the liner nitride film 150 may be oxidized using the HDP.

Figure 2G:
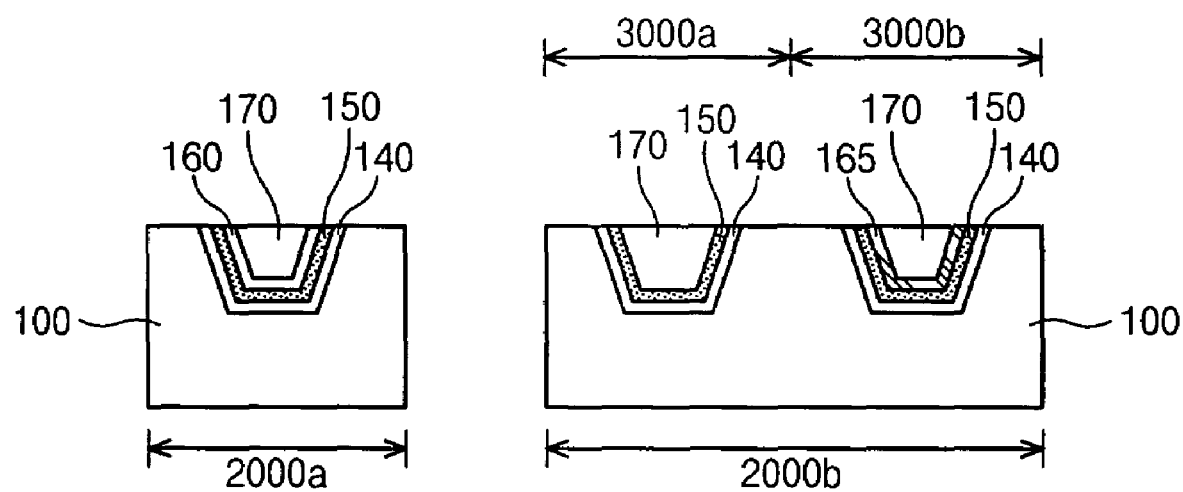
Figure 3B:
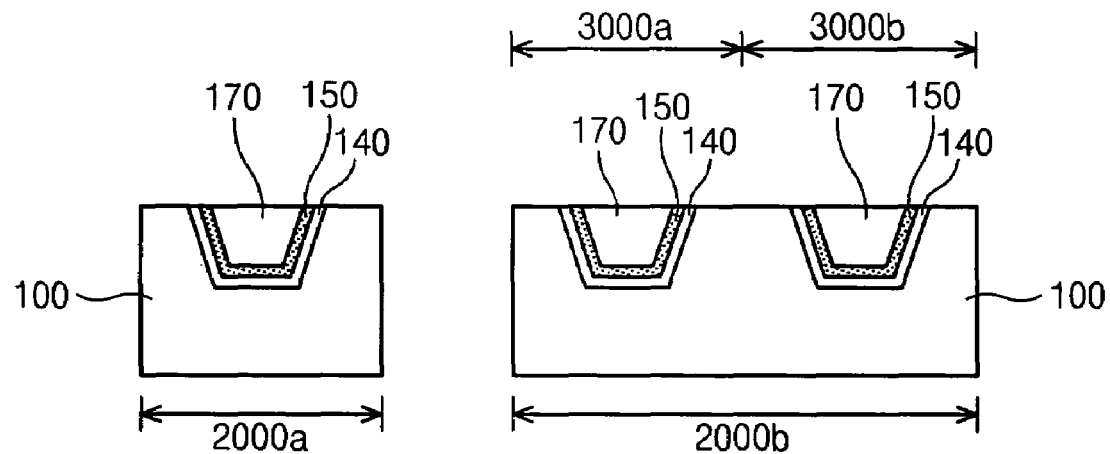

Referring to FIG. 2g, a planarization process is performed via a Chemical Mechanical Polishing (CMP) process to expose the pad nitride film 120. Thereafter, the pad nitride film 120 and the pad oxide film 110 are removed to form a device isolation film 180. When the entire liner oxide film 160 in the peripheral region 2000b is removed in accordance with one embodiment of the present invention, a device isolation film 180 shown in FIG. 3b is obtained.

As described above, in accordance with various embodiments of the present invention, the liner nitride film is exposed by removing the liner oxide the film in peripheral region and then oxidized using plasma prior to the formation of a device isolation film to reduce the generation of an electron trap, thereby reducing or preventing occurrence of the HEIP phenomenon and/or degradation of the semiconductor device due to the HEIP phenomenon. In addition, the HEIP phenomenon can be effectively controlled or prevented without substantially increasing the thickness of the sidewall oxide film, thereby reducing or preventing a decrease in driving current and threshold voltage of a transistor and a deterioration of refresh characteristics of a semiconductor device.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for manufacturing a device isolation film of a semiconductor device, comprising:
   sequentially forming a pad oxide film and a pad nitride film on a semiconductor substrate, wherein the semiconductor substrate comprises a cell region; and a peripheral region including a pMOS region and an nMOS region;
   etching a predetermined region of the pad nitride film, the pad oxide film and the semiconductor substrate where the device isolation film is to be formed to form a trench;
   forming a sidewall oxide film on a surface of the trench;
   sequentially forming a liner nitride film and a liner oxide film on a surface of the semiconductor substrate including the trench and the pad nitride film;
   removing at least a portion of the liner oxide film in the pMOS region of the peripheral region to expose a portion of the liner nitride film;
   oxidizing the exposed portion of the liner nitride film;
   forming a gap-filling oxide film on the semiconductor substrate to substantially fill the trench;
   performing a planarization process to expose the pad nitride film; and
   removing the pad nitride film and the pad oxide film.

2. The method according to claim 1, further comprising thermally treating the sidewall oxide film under one of a NH3, a N2O and a NO atmosphere.

3. The method according to claim 1, further comprising thermally treating the liner nitride film under a H2 atmosphere.

4. The method according to claim 1, wherein removing at least a portion of the liner oxide film comprises:
   forming a photoresist film covering the cell region and the nMOS region of the peripheral region; and
   etching the liner oxide film in the pMOS region using the photoresist film as an etching mask.

5. The method according to claim 1, wherein removing at least a portion of the liner oxide film comprises:
   forming a photoresist film covering the cell region; and etching the liner oxide film in the nMOS region and the pMOS region of the peripheral region using the photoresist film as an etching mask.

6. The method according to claim 1, wherein oxidizing the exposed portion of the liner nitride film oxidizes the exposed portion of the liner nitride film with a plasma.

7. The method according to claim 1, wherein a thickness of the sidewall oxide film is within a range of about 20 Å to about 200 Å.

8. The method according to claim 1, wherein a thickness of the liner nitride film is within a range of about 20 Å to about 100 Å.

9. The method according to claim 1, wherein a thickness of the liner oxide film is within a range of about 20 Å to about 200 Å.

10. The method according to claim 1, wherein the planarization process comprises a Chemical Mechanical Polishing (CMP) process.

11. The method according to claim 1, wherein oxidizing the exposed portion the liner nitride film and forming the gap-filling oxide film are performed simultaneously.

* * * * *